US006529025B1

United States Patent
Kline

(12) 
(10) Patent No.: US 6,529,025 B1
(45) Date of Patent: Mar. 4, 2003

(54) ELECTRICAL CONTINUITY ENHANCEMENT FOR SOCKETS/CONTACTORS

(75) Inventor: Eric V. Kline, Stillwater, MN (US)

(73) Assignee: JohnsTech International Corporation, Minneapolis, MN (US)

( * ) Notice: Subject to any disclaimer, the term of this patent is extended or adjusted under 35 U.S.C. 154(b) by 0 days.

(21) Appl. No.: 09/156,808

(22) Filed: Sep. 18, 1998

Related U.S. Application Data

(60) Provisional application No. 60/059,231, filed on Sep. 18, 1997.

(51) Int. Cl.$^7$ ................................................. G01R 31/02
(52) U.S. Cl. ..................................... 324/757; 324/158.1
(58) Field of Search ................................. 324/754, 757, 324/760, 72.5, 761, 158.1, 755, 756; 439/70, 73, 331, 525, 66, 71

(56) References Cited

U.S. PATENT DOCUMENTS

| | | | | |
|---|---|---|---|---|
| 3,996,516 A | * | 12/1976 | Luther | 324/761 |
| 4,445,735 A | * | 5/1984 | Bonnefoy | 439/591 |
| 4,820,976 A | * | 4/1989 | Brown | 324/760 |
| 5,069,629 A | * | 12/1991 | Johnson | 439/591 |
| 5,207,584 A | * | 5/1993 | Johnson | 439/66 |
| 5,609,489 A | * | 3/1997 | Bickford et al. | 439/72 |
| 6,296,171 B1 | * | 10/2001 | Hembree et al. | 156/73.1 |

\* cited by examiner

*Primary Examiner*—Michael Sherry
*Assistant Examiner*—Minh N. Tang
(74) *Attorney, Agent, or Firm*—Nawrocki, Rooney & Sivertson, P.A.

(57) ABSTRACT

A high performance electromechanical device which improves electrical continuity between a device under test (DUT) and a socket (or contactor), ideally suited for, but not limited to, automated semiconductor test. An ultrasonic transducer is incorporated into the test set-up such that its ultrasonic energy is coupled either into the DUT and thereby into the contacts of the socket or is coupled into the contacts of the socket and thereby into the leads (or equivalent I/O) of the DUT. This coupled ultrasonic energy generates a high frequency mechanical wipe action of microscopic amplitude between the contacting surfaces, thereby displacing oxides and other debris from the contact site. This enhances electrical continuity by reducing apparent contact resistance and by reducing the apparent contact resistance force rate. This high frequency/low amplitude mechanical wipe action can be varied and controlled to yield an effective wipe which is from 10 times to 100,000 times greater than the current state of the art.

18 Claims, 2 Drawing Sheets

ELECTRICAL CONTINUITY ENHANCEMENT FOR SOCKETS/CONTACTORS

CROSS REFERENCE TO RELATED APPLICATIONS

This is a regular application filed under 35 U.S.C. §111(a) claiming priority, under 35 U.S.C. §119(e)(1), of provisional application Serial No. 60/059,231, previously filed Sep. 18, 1997 under 35 U.S.C. §111(b).

BACKGROUND OF THE INVENTION

1. Field of the Invention

The present invention deals broadly with the field of electrical interconnect systems, and more specifically to an electromechanical device which improves electrical continuity between a device under test (DUT), and a socket or contactor.

2. Description of the Prior Art

A plethora of applications exist for effecting electrical contact between two conductors. Once significant application is effecting interconnection between the leads of an integrated circuit device and conductive pads or terminals on a printed circuit board which serves to effect an interface between the integrated circuit (IC) device and a tester apparatus. Such apparatus are used to evaluate performance of integrated circuit devices.

Numerous considerations bear upon the contact structure employed to interconnect the IC and the printed circuit board. These factors include both electrical and mechanical considerations.

In practice, the design of contacts often render them more susceptible to environmental effects than most other components in an electronic system. Under certain operating conditions, corrosion (such as oxide build-up) can set in on the contact apparatus, causing changes in the contact resistance, resulting in intermittent failures on the contact. Such failures are difficult to detect visually, and can be of critical importance in high-speed digital electronics applications which must have uninterrupted operation to function properly.

One way in which designers of contact systems have dealt with the build up of oxides and other corrosive materials at contact points is through the introduction of a mechanical "wiping action" between the contact itself and the lead of an integrated circuit by which the contact is engaged. The wiping action functions to effect maximization of effective contact in view of oxide build-up which can occur. In effect, the wiping action enables a good interface to be accomplished between the contact and the lead of the IC. Some examples of this concept of a mechanical wiping action can be found in the Contact of U.S. Pat. No. 4,445,735 issued to Bonnefoy on May 1, 1984 and the Contact of U.S. Pat. No. 5,207,584 issued to Johnson on May 4, 1993. Column 2, lines 62–68 and column 3, lines 1–2 of this invention provides: "A rigid first element is received in the trough formed in the first surface and extends across any slots in which one or more contacts are received. An elastomeric second element is received in the trough formed in the second surface of the housing and extends across the one or more slots in which contacts are received. The elastomeric second element is provided with a measure of compressibility and tensile extendability." Further in column 3, lines 32–48: "As a particular lead of an integrated circuit device engages the protrusion of a corresponding contact and exerts downward pressure upon the protrusion, the channel in the contact will move relatively to the rigid first element received therein, and the contact will, effectively, be made to rotate to some extent as a result of the rigid first element moving, relative to the contact, more deeply into the channel formed in the contact. The downward force exerted by the lead of the integrated circuit upon the contact will have components along both X and Y axes, and these components will effect the apparent rotation of the contact. As a result, the protrusion will move laterally to some degree across the surface of the integrated circuit lead by which it is engaged, and the nub of the contact will move laterally across the integrated circuit board terminal with which it is in contact."

Another approach which has been undertaken to improve the electrical continuity performance of semiconductor test systems is the introduction of a low frequency/high amplitude ultrasonic transducer into an interconnect system. In such a system, the microscopic mechanical wiping action produced from a low frequency/high amplitude ultrasonic transducer serves to clean the contact site and reduces the site's apparent contact resistance. One problem inherent to the low frequency/high amplitude approach is its low effective wiping action due to its extremely low frequency of operation.

SUMMARY OF THE INVENTION

The present invention overcomes many of the disadvantages associated with the prior art by providing a high performance electromechanical device which improves electrical continuity between a device under test (DUT) and a socket (or contactor), ideally suited for, but not necessarily limited to automated semiconductor test.

In this present invention, an ultrasonic transducer is incorporated into the test set-up such that its ultrasonic energy is coupled either into the DUT and thereby into the contacts of the socket or is coupled into the contacts of the socket and thereby into the leads (or equivalent I/O) of the DUT. It is the coupling of the ultrasonic energy between the leads (or other contact I/O) of the DUT and the contacts of the socket, for the purpose of enhancing electrical continuity, that comprises the present invention.

The present invention enhances electrical continuity by reducing apparent contact resistance and by reducing the apparent contact resistance force rate. These parameters are effectively reduced by virtue of a high frequency but small amplitude mechanical wiping action between the contacting surfaces, generated by said ultrasonic coupling. This high frequency/low amplitude mechanical wipe action can be varied and controlled to yield an effective wipe which is from 10 times to 100,000 times greater than the current state of the art (a low frequency/high amplitude approach).

TABLE 1

Comparative Analysis of Effective Mechanical Wipe Action for Current Technology and the Present Invention

| PARAMETER | PRESENT INVENTION | CURRENT TECHNOLOGY |
|---|---|---|
| Description | High Frequency/Low Amplitude | Low Frequency/High Amplitude |
| Wide Amplitude | 0.05 to 0.50 mil | 2 to 10 (nominal 5) mils |
| Frequency | 1 KHZ to 100 KHZ | N/A or 1 |
| Effective Wipe Action | 100 to 100,000 mils/second | 5 mils (nominal) |

The "Effective Wipe Action" parameter shown in Table 1 above, typifies the difference between the current state of the art and the improvements incumbent to the present invention. Note that the value of the Effective Wipe Action parameter is referenced per second (of contact time). With such a great increase in the Effective Wipe Action parameter, one must be careful to limit contact force so that tribologic wear is not severely increased.

The present invention also allows the duration of the ultrasonic transducer's "on" time to be fixed and limited to some initial delay time. This time is sufficient to provide initial electrical continuity but allow testing of the DUT while the ultrasonic transducer is off. In another embodiment, the ultrasonic transducer's "on" time is variable and controlled so that initial electrical continuity between the DUT and the tester is monitored and controlled. A provision will be made to turn off the ultrasonic transducer at some (variable) time and fail the DUT for "continuity".

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1A:
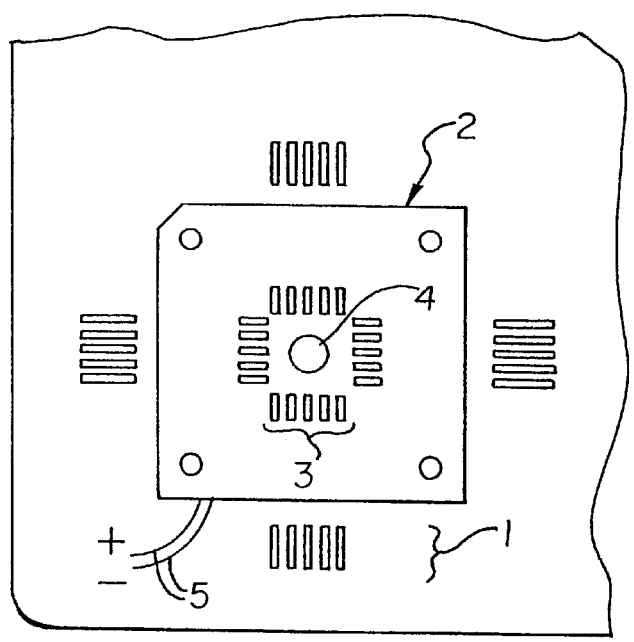
FIGS 1A & 1B show a generalized top view and a cross-sectional view, respectively, of a first embodiment of the present invention illustrating the ultrasonic coupling between the transducer and the contact elements, wherein the ultrasonic transducer is located within the socket.
Figure 1B:
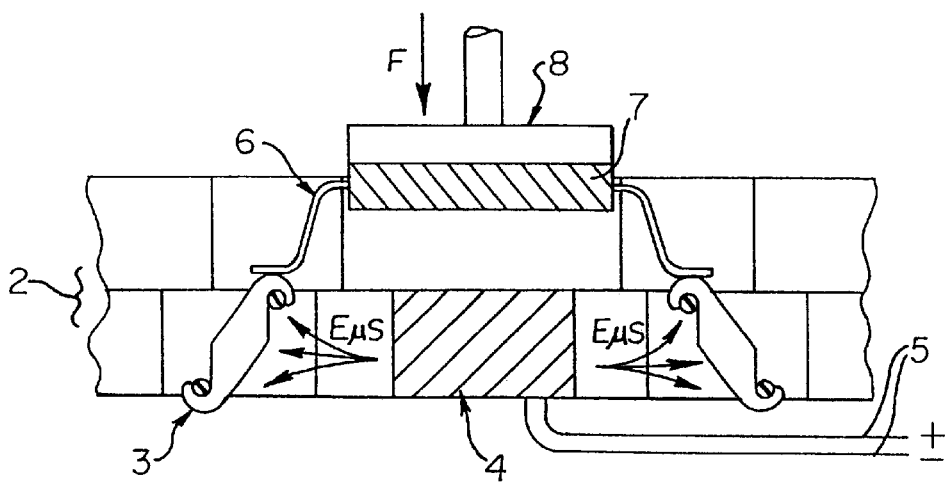

FIGS. 1A & 1B show a generalized top view and a cross-sectional view, respectively, of a first embodiment of the present invention illustrating the ultrasonic coupling between the transducer and the contact elements, wherein the ultrasonic transducer is located within the socket. In this embodiment, the direction of ultrasonic energy coupling is from the socket contacts to the DUT leads.

The load board 1 supports the socket 2 which supports the plurality of contact elements 3. The ultrasonic transducer 4 is situated within the socket 2 resulting in an efficient ultrasonic coupling between the transducer 4 and the contact elements 3. The ultrasonic transducer 4 is powered (and/or controlled) by some number of leads 5. The ultrasonic energy generated by the ultrasonic transducer 4 is coupled into the contact elements 3 via the socket 2. From the contact elements 3, the energy is coupled to the leads 6 of the device under test (DUT) 7, where the effective mechanical wiping action between the two contacting surfaces (3 and 6) reduces the apparent contact resistance and/or contact resistance force rate.

Figure 2A:
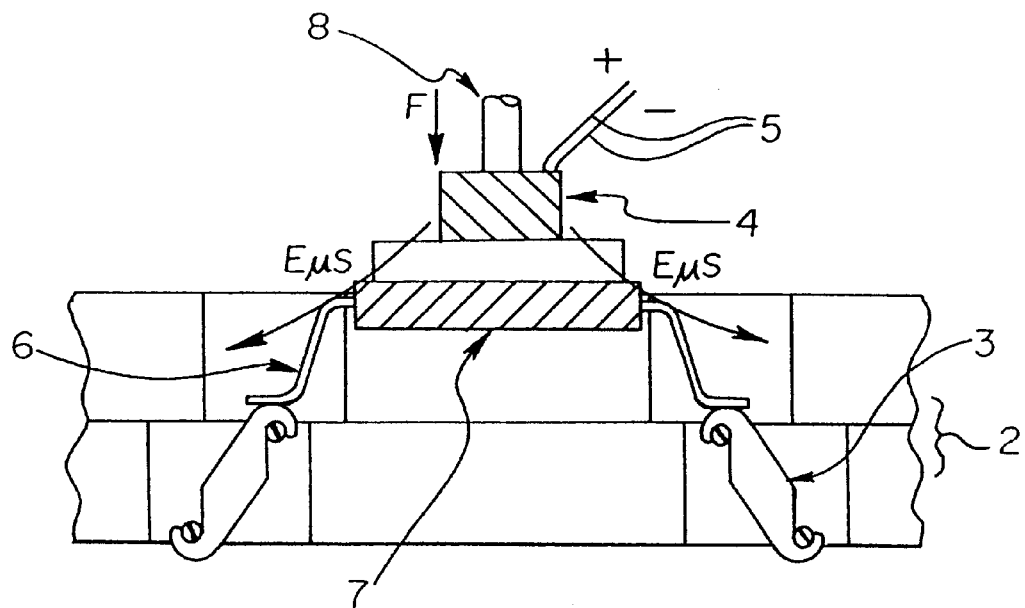
FIGS. 2A & 2B show two generalized cross-sectional views, respectively, of two additional embodiments of the present invention illustrating the ultrasonic coupling between the transducer and the contact elements, wherein the ultrasonic transducer is incorporated into the DUT driving means, or into the lead pushing device.
Figure 2B:
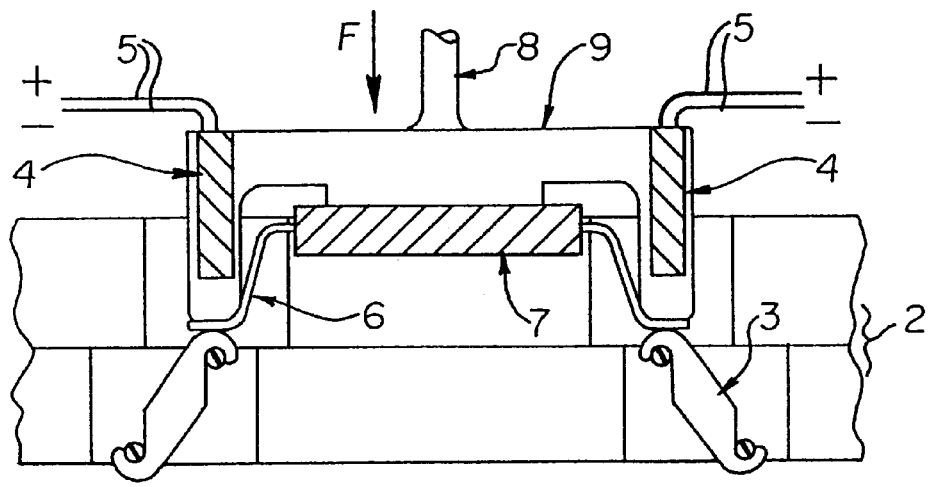

FIGS. 2A & 2B show two generalized cross-sectional views, respectively, of two additional embodiments of the present invention illustrating the ultrasonic coupling between the transducer and the contact elements, wherein the ultrasonic transducer is incorporated into the DUT driving means or, in the alternative, into the lead pushing device. In these two embodiments, the direction of ultrasonic energy coupling is from the DUT leads to the contacts of the socket.

In the first of these two embodiments (as shown in FIG. 2A), the ultrasonic transducer 4 is incorporated into the DUT driving means 8 so that the ultrasonic energy generated by the transducer 4 is coupled into the DUT 7 and into the DUT's leads 6, where it is further coupled to the socket's 2 contact elements 3 so that the effective wipe actions between the contacting surfaces (3 and 6) is enhanced in the disclosed manner.

In the second of the two embodiments (as shown in FIG. 2B), the ultrasonic transducer 4 is incorporated into the lead pushing device 9 (i.e. nest or lead backer, etc.), so that the ultrasonic energy is coupled directly into the DUT's leads 6, where it is further coupled into the socket's 2 contact elements 3 so that the effective wipe actions between the contacting surfaces (3 and 6) is enhanced in the disclosed manner.

Having thus described the preferred embodiments of the present invention, those of skill in the art will readily appreciate that the teachings found herein may be applied to yet other embodiments within the scope of the claims hereto attached.

What is claimed is:

1. An electromechanical device incorporated into an electronic test system, wherein said electromechanical device improves electrical continuity between at least one lead of an electronic device under test (DUT) and at least one corresponding contact element of a device socket/contactor, comprising:

a high-frequency, low-amplitude ultrasonic transducer incorporated into said electronic test system, wherein said contact elements are supported by elastomeric second elements arranged so that an end of each contact element is displaced laterally by engagement of a lead of a DUT, and wherein ultrasonic energy produced by said transducer produces a lateral displacement of each of said contact elements resulting in a mechanical wiping action on said leads and said contact elements resulting in enhanced electrical continuity between said leads and said contact elements.

2. An electromechanical device in accordance with claim 1 wherein said ultrasonic transducer is incorporated into said socket/contactor.

3. An electromechanical device in accordance with claim 2 wherein power output produced by said ultrasonic transducer is variable.

4. An electromechanical device in accordance with claim 2 wherein said frequency output produced by said ultrasonic transducer is variable.

5. An electromechanical device in accordance with claim 2 wherein said ultrasonic transducer's operation time is fixed and limited to some initial delay time, wherein said delay time is sufficient to provide initial electrical continuity but allow testing of the DUT while the ultrasonic transducer is off.

6. An electromechanical device in accordance with claim 2 wherein said ultrasonic transducer's operation time is variable and controlled so that initial electrical continuity between the DUT and said electronic test system is monitored and controlled.

7. An electromechanical device in accordance with claim 1 wherein the electronic test system includes a DUT pushing means for applying pressure on the DUT such that the DUT is in electromechanical contact with said socket/contactor.

8. An electromechanical device in accordance with claim 7 wherein said ultrasonic transducer is incorporated into said DUT pushing means.

9. An electromechanical device in accordance with claim 8 wherein power output produced by said ultrasonic transducer is variable.

10. An electromechanical device in accordance with claim 8 wherein said frequency output produced by said ultrasonic transducer is variable.

11. An electromechanical device in accordance with claim 8 wherein said ultrasonic transducer's operation time is fixed and limited to some initial delay time, wherein said delay time is sufficient to provide initial electrical continuity but allow testing of the DUT while the ultrasonic transducer is off.

12. An electromechanical device in accordance with claim 8 wherein said ultrasonic transducer's operation time is variable and controlled so that initial electrical continuity between the DUT and said electronic test system is monitored and controlled.

13. An electromechanical device in accordance with claim 1 wherein the electronic test system includes a DUT lead pushing means for applying pressure on the leads of the DUT such that the leads of the DUT are in electromechanical contact with the contact elements of the socket/contactor.

14. An electromechanical device in accordance with claim 13 wherein said ultrasonic transducer is incorporated into said DUT lead pushing means.

15. An electromechanical device in accordance with claim 14 wherein power output produced by said ultrasonic transducer is variable.

16. An electromechanical device in accordance with claim 14 wherein said frequency output produced by said ultrasonic transducer is variable.

17. An electromechanical device in accordance with claim 14 wherein said ultrasonic transducer's operation time is fixed and limited to some initial delay time, wherein said delay time is sufficient to provide initial electrical continuity but allow testing of the DUT while the ultrasonic transducer is off.

18. An electromechanical device in accordance with claim 14 wherein said ultrasonic transducer's operation time is variable and controlled so that initial electrical continuity between the DUT and said electronic test system is monitored and controlled.

* * * * *